United States Patent
Li

(10) Patent No.: US 9,893,205 B2
(45) Date of Patent: Feb. 13, 2018

(54) THIN FILM TRANSISTOR, ARRAY SUBSTRATE AND LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventor: Shan Li, Shenzhen (CN)

(73) Assignee: SHENZHEN CHINA STAR OPTOELECTRONICS TECHNOLOGY CO., LTD., Shenzen (CN)

( * ) Notice: Subject to any disclaimer, the term of this patent is extended or adjusted under 35 U.S.C. 154(b) by 244 days.

(21) Appl. No.: 14/773,117

(22) PCT Filed: Jul. 28, 2015

(86) PCT No.: PCT/CN2015/085282
§ 371 (c)(1),
(2) Date: Sep. 4, 2015

(87) PCT Pub. No.: WO2016/206163
PCT Pub. Date: Dec. 29, 2016

(65) Prior Publication Data
US 2017/0133515 A1    May 11, 2017

(30) Foreign Application Priority Data
Jun. 26, 2015 (CN) .......................... 2015 1 0364687

(51) Int. Cl.
*G02F 1/1335* (2006.01)
*H01L 29/786* (2006.01)
(Continued)

(52) U.S. Cl.
CPC ...... *H01L 29/78696* (2013.01); *G02F 1/1368* (2013.01); *G02F 1/133514* (2013.01); *G02F 1/136286* (2013.01); *H01L 27/124* (2013.01); *H01L 27/127* (2013.01); *H01L 27/1225* (2013.01); *H01L 29/4908* (2013.01);
(Continued)

(58) Field of Classification Search
CPC ............ G02F 1/1362; G02F 1/133514; G02F 1/1368; G02F 1/136286; H01L 29/78696; H01L 29/4908; H01L 27/1225; H01L 27/124; H01L 27/127
See application file for complete search history.

(56) References Cited

U.S. PATENT DOCUMENTS

2014/0034945 A1* 2/2014 Tokunaga ............... H01L 29/24
257/43
2014/0111725 A1* 4/2014 Miyamoto ........ G02F 1/136213
349/43

(Continued)

*Primary Examiner* — James Dudek
(74) *Attorney, Agent, or Firm* — Sughrue Mion, PLLC

(57) ABSTRACT

A thin film transistor, an array substrate and a liquid crystal display panel are provided. The thin film transistor has an active layer which is formed from nitrogen-doped oxide semiconductor layers and a non-nitrogen doped oxide semiconductor layer. By disposing the non-nitrogen doped oxide semiconductor layer in the active layer of the nitrogen-doped thin film transistor, the mobility of the thin film transistor is kept constant for improving the reliability of the thin film transistor.

17 Claims, 2 Drawing Sheets

(51) Int. Cl.
*H01L 29/49* (2006.01)
*H01L 27/12* (2006.01)
*G02F 1/1368* (2006.01)
*G02F 1/1362* (2006.01)
*H01L 29/423* (2006.01)

(52) U.S. Cl.
CPC .. *H01L 29/78693* (2013.01); *G02F 2201/123* (2013.01); *G02F 2202/10* (2013.01); *H01L 2029/42388* (2013.01)

(56) References Cited

U.S. PATENT DOCUMENTS

| | | | |
|---|---|---|---|
| 2015/0243677 A1* | 8/2015 | Zhang | H01L 27/124 257/59 |
| 2016/0005870 A1* | 1/2016 | Huang | H01L 29/786 257/43 |
| 2017/0155003 A1* | 6/2017 | Tokunaga | H01L 29/78696 |

* cited by examiner

THIN FILM TRANSISTOR, ARRAY SUBSTRATE AND LIQUID CRYSTAL DISPLAY PANEL

CROSS REFERENCE TO RELATED APPLICATIONS

This is a National Stage of International Application No. PCT/CN2015/085282 filed Jul. 28, 2015, claiming priority based on Chinese Patent Application No. 201510364687.1 filed Jun. 26, 2015, the contents of all of which are incorporated herein by reference in their entirety.

FIELD OF THE INVENTION

The present invention relates to the technical field of liquid crystal displays, and particularly to a thin film transistor, an array substrate and a liquid crystal display panel.

BACKGROUND OF THE INVENTION

Amorphous oxide semiconductor (AOS) thin film transistors (TFT) have favorable electrical properties, high transparency and low temperature in the manufacturing process, etc., so as to attract considerable people's attention, and are one of the most powerful competitors of active electronic devices for driving displays of a new generation of panels. Common AOS TFTs include an indium gallium zinc oxide thin film transistor (IGZO TFT), a IZO TFT, a ZTO TFT, etc.

In order to improve certain electrical indexes and stability of TFT devices, the level of oxygen vacancies in the active layer of the AOS TFT is conventionally regulated by nitrogen, that is, nitrogen is doped in the active layer of the AOS TFT. This type of AOS TFT is referred to as a nitrogen-doped amorphous oxide thin film transistor. However, doping nitrogen generally causes a decline in mobility, which is unfavorable to the manufacturing of AOS TFT devices having high mobility for meeting the engineering application requirements in the field of panel displays. Therefore, keeping the field effect mobility of nitrogen-doped AOS-TFT devices constant is significant in manufacturing.

SUMMARY OF THE INVENTION

A primary object of the present invention is to provide a thin film transistor, an array substrate and a liquid crystal display panel to keep the field effect mobility of a nitrogen-doped AOS TFT device constant.

To resolve the aforementioned technical problem, the technical solutions are as follows.

A thin film transistor is provided in the embodiment of the present invention, comprising:
  a gate electrode;
  a gate insulating layer which is formed on the gate electrode;
  an active layer which is formed on the gate insulating layer, and formed from a nitrogen-doped oxide semiconductor layer and a non-nitrogen doped oxide semiconductor layer; and
  a source electrode and a drain electrode which are respectively formed on both sides of the active layer.

In the thin film transistor of the present invention, the active layer includes at least two of the nitrogen-doped oxide semiconductor layers and at least one of the non-nitrogen doped oxide semiconductor layer, and the non-nitrogen doped oxide semiconductor layer is formed between two of the adjacent nitrogen-doped oxide semiconductor layers.

In the thin film transistor of the present invention, the thickness of each of the nitrogen-doped oxide semiconductor layer is different from the thickness of the non-nitrogen doped oxide semiconductor layer.

In the thin film transistor of the present invention, the thickness of each of the nitrogen-doped oxide semiconductor layer is equal to the thickness of the non-nitrogen doped oxide semiconductor layer.

In the thin film transistor of the present invention, the thickness of any two of the nitrogen-doped oxide semiconductor layer are equal to each other.

In the thin film transistor of the present invention, the thicknesses of any two of the nitrogen-doped oxide semiconductor layer are different from each other.

In the thin film transistor of the present invention, the active layer includes two of the nitrogen-doped oxide semiconductor layers and one of the non-nitrogen-doped oxide semiconductor layer.

In the thin film transistor of the present invention, the thicknesses of the nitrogen-doped oxide semiconductor layers are ranged from 8 nm to 12 nm, and the thickness of the non-nitrogen doped oxide semiconductor layer is ranged from 8 nm to 12 nm.

In the thin film transistor of the present invention, the thickness of the gate insulating layer is ranged from 98 nm to 102 nm.

In the thin film transistor of the present invention, the material of the gate insulating layer is silicon oxide.

An array substrate is provided in the embodiment of the present invention, comprising:
  a substrate on which a plurality of data lines, a plurality of scan lines, a plurality of pixel units, and a thin film transistor are formed;
  the data lines being used for transmitting data signals to a corresponding source electrode of the thin film transistor;
  the scan lines being used for transmitting scan signals to a corresponding gate electrode of the thin film transistor; and
  the thin film transistor being used for controlling whether to transfer the data signals to the corresponding pixel electrodes through a drain electrode of the thin film transistor based on the scan signals;
  wherein the thin film transistor includes:
  a gate electrode;
  a gate insulating layer which is formed on the gate electrode;
  an active layer which is formed on the gate insulating layer, and formed from a nitrogen-doped oxide semiconductor layer and a non-nitrogen doped oxide semiconductor layer; and
  a source electrode and the drain electrode which are respectively formed on both sides of the active layer.

In the array substrate of the present invention, the active layer includes at least two of the nitrogen-doped oxide semiconductor layers and at least one of the non-nitrogen doped oxide semiconductor layer, and the non-nitrogen doped oxide semiconductor layer is formed between two of the adjacent nitrogen-doped oxide semiconductor layers.

In the array substrate of the present invention, the active layer includes two of the nitrogen-doped oxide semiconductor layers and a non-nitrogen-doped oxide semiconductor layer located between the two nitrogen-doped oxide semiconductor layers.

In the array substrate of the present invention, the thickness of each of the nitrogen-doped oxide semiconductor layers are equal to the thickness of the non-nitrogen doped oxide semiconductor layer.

In the array substrate of the present invention, the thicknesses of any two of the nitrogen-doped oxide semiconductor layers are equal to each other.

In the array substrate of the present invention, the thicknesses of the nitrogen-doped oxide semiconductor layers are ranged from 8 nm to 12 nm, and the thickness of the non-nitrogen doped oxide semiconductor layer is ranged from 8 nm to 12 nm.

A liquid crystal display panel is provided in the embodiment of the present invention, comprising:
a color filter substrate;
an array substrate including a plurality of data lines, a plurality of scan lines, a plurality of pixel units, and a thin film transistor; and
a liquid crystal layer disposed between the color filter substrate and the array substrate;
the data lines being used for transmitting data signals to a corresponding source electrode of the thin film transistor;
the scan lines being used for transmitting scan signals to a corresponding gate electrode of the thin film transistor; and
the thin film transistor being used for controlling whether to transfer the data signals to the corresponding pixel electrodes through a drain electrode of the thin film transistor based on the scan signals;
wherein the thin film transistor includes:
a gate electrode;
a gate insulating layer which is formed on the gate electrode;
an active layer which is formed on the gate insulating layer, and formed from a nitrogen-doped oxide semiconductor layer and a non-nitrogen doped oxide semiconductor layer; and
a source electrode and the drain electrode which are respectively formed on both sides of the active layer.

In the liquid crystal display panel of the present invention, the active layer includes at least two of the nitrogen-doped oxide semiconductor layers and at least of the one non-nitrogen doped oxide semiconductor layer, and the non-nitrogen doped oxide semiconductor layer is formed between two of the adjacent nitrogen-doped oxide semiconductor layers.

In the liquid crystal display panel of the present invention, the active layer includes two of the nitrogen-doped oxide semiconductor layers and one of the non-nitrogen-doped oxide semiconductor layer.

In the liquid crystal display panel of the present invention, the thicknesses of the nitrogen-doped oxide semiconductor layers are ranged from 8 nm to 12 nm, and the thickness of the non-nitrogen doped oxide semiconductor layer is ranged from 8 nm to 12 nm.

A thin film transistor, an array substrate and a liquid crystal display panel are provided in the present invention. The active layer in the thin film transistor of the present invention is formed from a nitrogen-doped oxide semiconductor layer and a non-nitrogen doped oxide semiconductor layer. By the non-nitrogen doped oxide semiconductor layer keeping enough oxygen vacancies in the active layer, the required number of carriers are provided, and the mobility of the thin film transistor (eg. AOS TFT) is further kept constant, which is favorable to enhancing the reliability of the thin film transistor and reducing manufacturing costs.

DETAILED DESCRIPTION OF THE PREFERRED EMBODIMENTS

Figure 1:
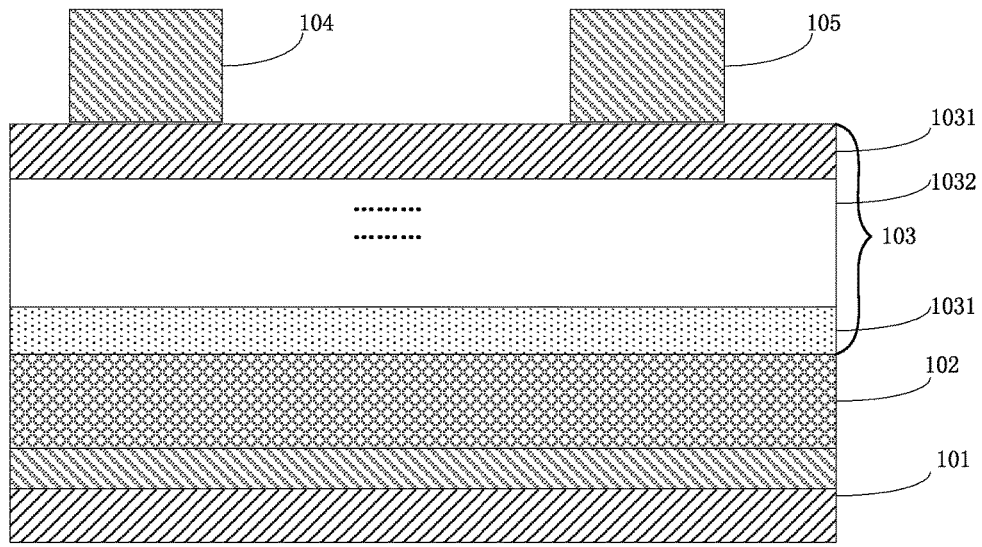
FIG. 1 is a structural schematic diagram of a first thin film transistor provided by a first embodiment of the present invention.

The following description of the embodiments with reference to the accompanying drawings is used to illustrate particular embodiments of the present invention. The directional terms referred in the present invention, such as "upper", "lower", "front", "back", "left", "right", "inner", "outer", "side", etc. are only directions with regard to the accompanying drawings. Therefore, the directional terms used for describing and illustrating the present invention are not intended to limit the present invention. In the drawings, units with similar structures are indicated by the same reference number.

First Embodiment

As shown in FIG. 1, the present embodiment provides a thin film transistor (for example, AOS TFT), including: a gate electrode 101, a gate insulating layer 102, an active layer 103, and a source electrode 104 and a drain electrode 105 of the thin film transistor.

In the present embodiment, the gate insulating layer 102 is located on the gate electrode 101, and can be formed by chemical deposition; the active layer 103 is located on the gate insulating layer 102, and can be formed by chemical deposition, wherein the material forming the active layer 103 can be a nitrogen-doped amorphous oxide semiconductor, such as nitrogen-doped a-IGZO and the like.

In the present embodiment, the active layer 103 is formed from the nitrogen-doped oxide semiconductor layer 1031 and the non-nitrogen doped oxide semiconductor layer 1032. In FIG. 1, the active layer 103 includes at least two of the nitrogen-doped oxide semiconductor layers 1031 and at least one of the non-nitrogen doped oxide semiconductor layer 1032.

In the present embodiment, the numbers of the nitrogen-doped oxide semiconductor layers 1031 and non-nitrogen doped semiconductor layer 1032 in the active layer 103 can be set according to actual needs. For example, the active layer may include three nitrogen-doped oxide semiconductor layers 1031 and two non-nitrogen doped oxide semiconductor layers 1032, etc.

In the nitrogen-doped thin film transistor in the present embodiment, the non-nitrogen doped oxide semiconductor layer 1032 is added into the active layer of the thin film transistor. By the non-nitrogen doped oxide semiconductor layer keeping enough oxygen vacancies in the active layer, the required number of carriers are provided, and the mobility of the thin film transistor (eg. AOS-TFT) is further kept constant, which is favorable to enhancing the reliability of the thin film transistor and reducing manufacturing costs.

Preferably, in the active layer 103 in the present embodiment, the thickness of each nitrogen-doped semiconductor layer 1031 may be equal or different. If the thicknesses are equal, the manufacturing of the thin film transistor can be facilitated, the manufacturing efficiency is improved, and the manufacturing cost is reduced; if the thicknesses are different, the different requirements for mobility in different application scenarios can be met, expanding the application field of the thin film transistor.

Preferably, in the active layer 103 in the present embodiment, the thicknesses of the nitrogen-doped semiconductor layers 1031 and the non-nitrogen doped semiconductor layer 1032 may be equal or different. If the thicknesses are equal, in the manufacturing of the thin film transistor, the nitrogen-doped semiconductor layers 1031 and the non-nitrogen doped semiconductor layers 1032 can be manufactured based upon the equal thickness dimension, improving manufacturing efficiency and reducing manufacturing cost; if the thicknesses are different, the different requirements for mobility in different application scenarios can be met, expanding the application field of the thin film transistor.

In order to keep the mobility of the thin film transistor constant, or increase the mobility of the thin film transistor, preferably, in the active layer 103 in the present embodiment, the non-nitrogen doped oxide semiconductor layer 1032 is formed between the two adjacent nitrogen-doped oxide semiconductor layers 1031, that is, the non-nitrogen doped oxide semiconductor layer 1032 can be formed between any of the two adjacent nitrogen-doped oxide semiconductor layers 1031.

In the present embodiment, when the size and the manufacturing process of the thin film transistor are taken into account, preferably, the thicknesses of the nitrogen-doped oxide semiconductor layers 1031 are ranged from 8 nm to 12 nm, and the thickness of the non-nitrogen doped oxide semiconductor layer 1032 is ranged from 8 nm to 12 nm in this embodiment.

Figure 2:
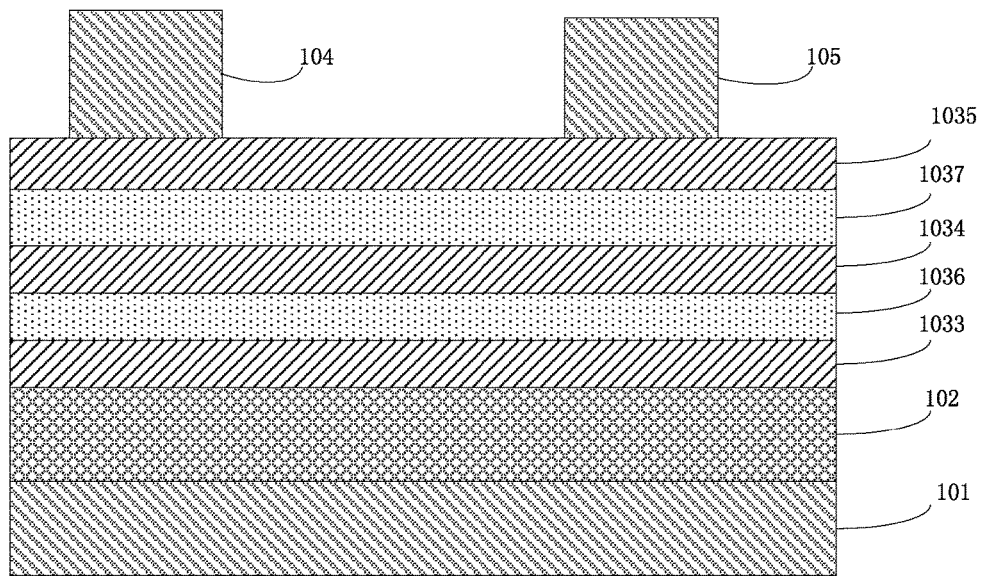
FIG. 2 is a structural schematic diagram of a second thin film transistor provided by a first embodiment of the present invention.

As shown in FIG. 2, another thin film transistor is provided in the present embodiment, which has an active layer 103 including a first nitrogen-doped oxide semiconductor layer 1033, a second nitrogen-doped oxide semiconductor layer 1034, a third nitrogen-doped oxide semiconductor 1035, a first non-nitrogen doped oxide semiconductor layer 1036 and a second non-nitrogen doped oxide semiconductor layer 1037, wherein the first non-nitrogen doped oxide semiconductor layer 1036 is located between the first nitrogen-doped oxide semiconductor layer 1033 and the second nitrogen-doped oxide semiconductor layer 1034; the second non-nitrogen doped oxide semiconductor layer 1037 is located between the second nitrogen-doped oxide semiconductor layer 1034 and the third nitrogen-doped oxide semiconductor layer 1035.

Figure 3:
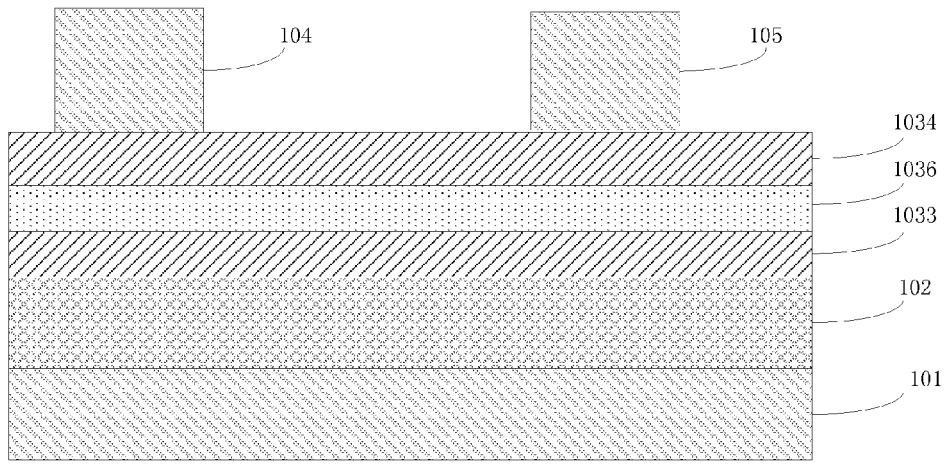
FIG. 3 is a structural schematic diagram of a third thin film transistor provided by a first embodiment of the present invention.

Since the active layers of most thin film transistors include three oxide semiconductor layers, when improving the application range of the thin film transistor is taken into account, preferably, the active layer 103 in the present embodiment may include two of the nitrogen-doped oxide semiconductor layers, and one of the non-nitrogen doped oxide semiconductor layer, wherein the non-nitrogen doped oxide semiconductor layer is located between the two nitrogen-doped oxide semiconductor layers. As shown in FIG. 3, yet another thin film transistor is provided in the present embodiment, whose the active layer 103 includes a first nitrogen-doped oxide semiconductor layer 1033, a second nitrogen-doped oxide semiconductor layer 1034, and a first non-nitrogen doped oxide semiconductor layer 1036 located between located between the first nitrogen-doped oxide semiconductor layer 1033 and the second nitrogen-doped oxide semiconductor layer 1034. The thicknesses of the first nitrogen-doped oxide semiconductor layer 1033, the second nitrogen-doped oxide semiconductor layer 1034, and the non-nitrogen doped oxide semiconductor layer 1036 may all be 10 nm, and the thickness of the gate insulating layer 102 may be 100 nm.

Preferably, in the present embodiment, the first nitrogen-doped oxide semiconductor layer 1033, the non-nitrogen doped oxide semiconductor layer 1036, and the second nitrogen-doped oxide semiconductor layer 1034 can be continuously deposited on the gate insulating layer 102 by using RF sputter. When the non-nitrogen doped oxide semiconductor layer 1036 is being deposited, argon is used; when the first nitrogen-doped oxide semiconductor layer 1033 and the second nitrogen-doped oxide semiconductor layer 1034 are being deposited, argon/nitrogen are used. The ratio of argon/nitrogen is adjusted based upon the actual situations.

Preferably, the thin film transistor shown in FIG. 3 may be a-IGZO TFT. The oxide semiconductor material in the active layer in the TFT may be a-IGZO.

By respectively testing a nitrogen-doped a-IGZO TFT, a non-nitrogen doped a-IGZO TFT, and a-IGZO TFT (referred to a nitrogen-doped buried-channel a-IGZO TFT) whose structure is shown in FIG. 3 in the present embodiment, the nitrogen-doped buried-channel device (BC) has both the lowest subthreshold swing (SS value) and the highest mobility, when compared with the devices in which the non-nitrogen doped or nitrogen-doped AOS is applied to the active layer.

The active layer of the thin film transistor in the present embodiment includes the nitrogen-doped oxide semiconductor layer, which can improve certain electrical indexes and the stability of the device. For example, the nitrogen-doped AOS layer is used in the front channel to improve the interface state between the active layer and the gate insulating layer, thereby improving the subthreshold swing (SS value) of the entire device, or the nitrogen-doped AOS layer is used in the back channel to reduce the level of the deep states (2 nm under the back channel) in the semiconductor of the active layer. Furthermore, the active layer of the thin film transistor in the embodiment includes the nitrogen-doped oxide semiconductor layer, which can simultaneously improve certain electrical indexes and stability of the device and keep the mobility of the device from decreasing. The thin film transistor in the present embodiment can be applied to the array substrate of the liquid crystal display panel for improving the stability of the array substrate, thereby enhancing the display quality of the liquid crystal display panel.

Second Embodiment

Figure 4:
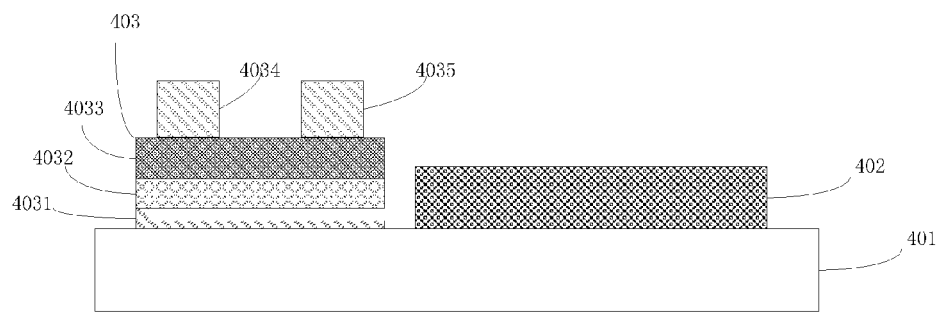
FIG. 4 is a structural schematic diagram of an array substrate provided by a second embodiment of the present invention.

An array substrate of a liquid crystal display panel is provided in the present embodiment, as shown in FIG. 4, including a substrate 401 on which a plurality of data lines (not shown in the FIGs.), a plurality of scan lines (not shown in FIGs.), a plurality of pixel electrodes 402, and a thin film transistor 403 are located. The thin film transistor 403 specifically includes a gate electrode 4031 which is formed on the substrate 401, a gate insulating layer 4032 which is formed on the gate electrode 4031, an active layer 4033 which is formed on the gate insulating layer 4032, and a source electrode 4034 and a drain electrode 4035 which are respectively formed on both sides of the active layer 4033.

The data lines are used for transmitting data signals to a corresponding source electrode of the thin film transistor. The scan lines are used for transmitting scan signals to a corresponding gate electrode of the thin film transistor. The thin film transistor 403 is used for controlling whether to transfer the data signals to the corresponding pixel electrodes 402 through the drain electrode 4035 of the thin film transistor 403 based on the scan signals.

Figure 5:
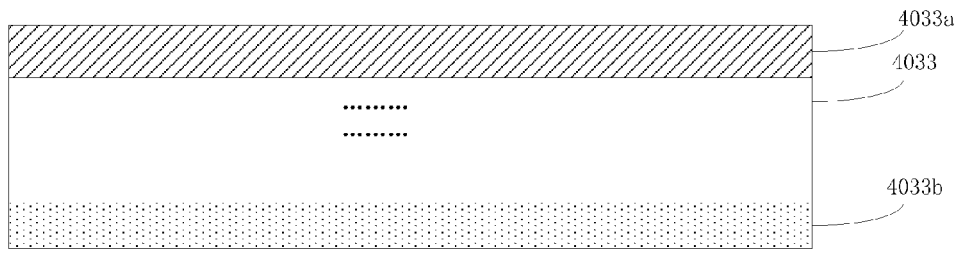
FIG. 5 is a structural schematic diagram of an active layer of a thin film transistor provided by a second embodiment of the present invention.

As shown in FIG. 5, in the present embodiment, the active layer 4033 may be formed from the nitrogen-doped oxide semiconductor layer 4033a and the non-nitrogen doped oxide semiconductor layer 4033b.

In the present embodiment, the numbers of the nitrogen-doped oxide semiconductor layers 4033a and the non-nitrogen doped oxide semiconductor layers 4033b in the active layer 4033 may be set according to the actual needs.

Since the active layer of TFT of the array substrate in the present embodiment includes the nitrogen-doped oxide semiconductor layer 4033a, the electrical indexes and the stability of the TFT are improved. Since the active layer of TFT of the array substrate in the present embodiment includes the non-nitrogen doped oxide semiconductor layer 4033b, the non-nitrogen doped oxide semiconductor layer 4033b keeps sufficient oxygen vacancies in the active layer 4033 for providing the required number of carriers, keeping the mobility of the device from decreasing, and preventing the problem of the decreased mobility of the devices caused by doping nitrogen in the active layer, thereby enhancing the stability of the array substrate, and meeting a variety of engineering application requirements in the liquid crystal display technical field.

In order to further prevent the mobility of the nitrogen-doped TFT device from decreasing, preferably, in the case where the active layer 4003 includes at least two of the nitrogen-doped oxide semiconductor layers 4033a and at least one of the non-nitrogen doped oxide semiconductor layer 4033b, the non-nitrogen doped oxide semiconductor layer 4033b is formed between the two adjacent nitrogen-doped oxide semiconductor layers 4033a, that is, one non-nitrogen doped oxide semiconductor layer 4033b is formed between each two adjacent nitrogen-doped oxide semiconductor layers 4033a.

Preferably, in the present embodiment, the active layer 4033 may include two of the nitrogen-doped oxide semiconductor layers 4033a and one of the non-nitrogen doped oxide semiconductor layer 4033b, wherein the non-nitrogen doped oxide semiconductor layer 4033b is located between the two adjacent nitrogen-doped oxide semiconductor layers 4033a. Pertaining to the specific structure, please refer to FIG. 3. Pertaining to the thicknesses of the semiconductor layers in the TFT active layer 4033 in the present embodiment, please refer to the description regarding the thicknesses of the semiconductor layers in the first embodiment.

The manufacturing process of the array substrate of the liquid crystal display panel in the present embodiment is described in detail as follows. The manufacturing process of the array substrate includes the following steps of:

(A) A first metal layer on a substrate is formed.

(B) The first metal layer is processed into patterns to form the scan lines and the gate electrode regions of the thin film field effect transistor. Specifically, the first metal layer is wet-etched by using the photo mask process to form the scan lines and the gate electrode regions of the thin film field effect transistor.

(C) A gate insulating layer is formed on the first metal layer, and subsequently, a first nitrogen-doped oxide semiconductor layer, a non-nitrogen doped oxide semiconductor layer, and a second nitrogen-doped oxide semiconductor layer are sequentially deposited on the gate insulating layer, that is, an active layer is deposited on the gate insulating layer.

(D) A second metal layer is formed on the second nitrogen-doped oxide semiconductor layer, and then the second metal is processed into patterns to form the source electrode regions of the thin film field effect transistor, the drain electrode regions of the thin film field effect transistor, the data lines, and the wires (E) The active layer and the second metal layer are processed into patterns to form the source electrode regions of the thin film field effect transistor, the drain electrode regions of the thin film field effect transistor, and the data lines. Specifically, the second metal layer is wet-etched, and the active layer is dry-etched for forming the source electrode regions of the thin film field effect transistor, the drain electrode regions of the thin film field effect transistor, and the channels between the source electrode regions and the drain electrode regions, and simultaneously forming the data lines of the liquid crystal display panel.

(F) Pixels electrodes are formed on the first metal layer.

Steps (A)-(F) complete the manufacturing process of the array substrate of the liquid crystal display panel.

Third Embodiment

Figure 6:
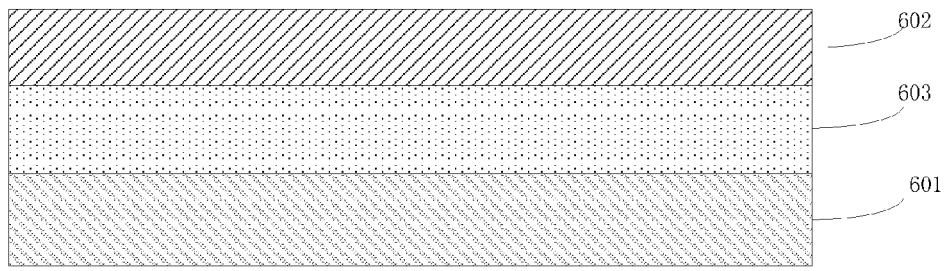
FIG. 6 is a structural schematic diagram of a liquid crystal panel provided by a third embodiment of the present invention.

A liquid crystal display panel is provided in the present embodiment, as shown in FIG. 6, including a color filter substrate 601, an array substrate 602, and a liquid crystal layer 603 disposed between the color filter substrate 601 and the array substrate 602. The structure of the array substrate 602, as referred to FIG. 4, includes a substrate, on which a plurality of data lines, a plurality of scan lines, a plurality of pixel electrodes, and a thin film transistor 403 are located. The data lines are used for transmitting data signals to a corresponding source electrode of the thin film transistor. The scan lines are used for transmitting scan signals to a corresponding gate electrode of the thin film transistor. The thin film transistor is used for controlling whether to transfer the data signals to the corresponding pixel electrodes through the drain electrode of the thin film transistor based on the scan signals. The thin film transistor specifically includes a gate electrode which is formed on the substrate, a gate insulating layer which is formed on the gate electrode, an active layer which is formed on the gate insulating layer, and a source electrode and a drain electrode, which are respectively formed on both sides of the active layer.

As shown in FIG. 5, the active layer is formed from the nitrogen-doped oxide semiconductor layer and the non-nitrogen doped oxide semiconductor layer.

Preferably, in the present embodiment, the active layer includes at least two of the nitrogen-doped oxide semiconductor layers and at least one of the non-nitrogen doped oxide semiconductor layer. The non-nitrogen doped oxide semiconductor layer is located between the two adjacent nitrogen-doped oxide semiconductor layers.

The TFT active layer in the array substrate in the present embodiment includes the nitrogen-doped oxide semiconductor layer for improving the electrical indexes and the stability of the TFT, and further enhancing the stability of the array substrate and the display quality of the liquid crystal display panel. Since the TFT active layer in the array substrate in the present embodiment includes the non-nitrogen doped oxide semiconductor layer, the non-nitrogen doped oxide semiconductor layer keeps sufficient oxygen vacancies in the active layer for providing the required number of carriers, keeping the mobility of the device from decreasing, and preventing the problem of the decreased mobility of the devices caused by doping nitrogen in the active layer, thereby enhancing the stability of the array substrate, and meeting a variety of engineering application requirements of the liquid crystal display technical field.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A thin film transistor, comprising:
   a gate electrode;
   a gate insulating layer which is formed on the gate electrode;
   an active layer which is formed on the gate insulating layer, and formed from a nitrogen-doped oxide semiconductor layer and a non-nitrogen doped oxide semiconductor layer; and
   a source electrode and a drain electrode which are respectively formed on both sides of the active layer,
   wherein the active layer includes at least two of the nitrogen-doped oxide semiconductor layers and at least one of the non-nitrogen doped oxide semiconductor layer, and the non-nitrogen doped oxide semiconductor layer is formed between two of the adjacent nitrogen-doped oxide semiconductor layers.

2. The thin film transistor as claimed in claim 1, wherein the thickness of each of the nitrogen-doped oxide semiconductor layers is different from the thickness of the non-nitrogen doped oxide semiconductor layer.

3. The thin film transistor as claimed in claim 1, wherein the thickness of each of the nitrogen-doped oxide semiconductor layers is equal to the thickness of the non-nitrogen doped oxide semiconductor layer.

4. The thin film transistor as claimed in claim 1, wherein the thicknesses of any two of the nitrogen-doped oxide semiconductor layers are equal to each other.

5. The thin film transistor as claimed in claim 1, wherein the thicknesses of any two of the nitrogen-doped oxide semiconductor layers are different from each other.

6. The thin film transistor as claimed in claim 1, wherein the active layer includes two of the nitrogen-doped oxide semiconductor layers and one of the non-nitrogen-doped oxide semiconductor layer.

7. The thin film transistor as claimed in claim 1, wherein the thickness of each of the nitrogen-doped oxide semiconductor layers is ranged from 8 nm to 12 nm, and the thickness of the non-nitrogen doped oxide semiconductor layer is ranged from 8 nm to 12 nm.

8. The thin film transistor as claimed in claim 1, wherein the thickness of the gate insulating layer is ranged from 98 nm to 102 nm.

9. The thin film transistor as claimed in claim 1, wherein the material of the gate insulating layer is silicon oxide.

10. An array substrate, comprising:
    a substrate on which a plurality of data lines, a plurality of scan lines, a plurality of pixel units and a thin film transistor are formed;
    the data lines being used for transmitting data signals to a corresponding source electrode of the thin film transistor;
    the scan lines being used for transmitting scan signals to a corresponding gate electrode of the thin film transistor; and
    the thin film transistor being used for controlling whether to transfer the data signals to the corresponding pixel units through a drain electrode of the thin film transistor based on the scan signals;
    wherein the thin film transistor includes:
    the gate electrode;
    a gate insulating layer which is formed on the gate electrode;
    an active layer which is formed on the gate insulating layer, and formed from a nitrogen-doped oxide semiconductor layer and a non-nitrogen doped oxide semiconductor layer; and
    the source electrode and the drain electrode which are respectively formed on both sides of the active layer,
    wherein the active layer includes at least two of the nitrogen-doped oxide semiconductor layers and at least one of the non-nitrogen doped oxide semiconductor layer, and the non-nitrogen doped oxide semiconductor layer is formed between two of the adjacent nitrogen-doped oxide semiconductor layers.

11. The array substrate as claimed in claim 10, wherein the active layer includes two of the nitrogen-doped oxide semiconductor layers and one of the non-nitrogen-doped oxide semiconductor layer located between the two nitrogen-doped oxide semiconductor layers.

12. The array substrate as claimed in claim 11, wherein the thickness of each of the nitrogen-doped oxide semiconductor layers is equal to the thickness of the non-nitrogen doped oxide semiconductor layer.

13. The array substrate as claimed in claim 11, wherein the thicknesses of any two of the nitrogen-doped oxide semiconductor layers are equal to each other.

14. The array substrate as claimed in claim 11, wherein the thickness of each of the nitrogen-doped oxide semiconductor layers is ranged from 8 nm to 12 nm, and the thickness of the non-nitrogen doped oxide semiconductor layer is ranged from 8 nm to 12 nm.

15. A liquid crystal display panel, comprising:
    a color filter substrate;
    an array substrate including a plurality of data lines, a plurality of scan lines, a plurality of pixel units and a thin film transistor; and
    a liquid crystal layer disposed between the color filter substrate and the array substrate;
    the data lines being used for transmitting data signals to a corresponding source electrode of the thin film transistor;
    the scan lines being used for transmitting scan signals to a corresponding gate electrode of the thin film transistor; and
    the thin film transistor being used for controlling whether to transfer the data signals to the corresponding pixel units through a drain electrode of the thin film transistor based on the scan signals;
    wherein the thin film transistor includes:
    the gate electrode;
    a gate insulating layer which is formed on the gate electrode;

an active layer which is formed on the gate insulating layer, and formed from a nitrogen-doped oxide semiconductor layer and a non-nitrogen doped oxide semiconductor layer; and the source electrode and the drain electrode which are respectively formed on both sides of the active layer, wherein the active layer includes at least two of the nitrogen-doped oxide semiconductor layers and at least one of the non-nitrogen doped oxide semiconductor layer, and the non-nitrogen doped oxide semiconductor layer is formed between two of the adjacent nitrogen-doped oxide semiconductor layers.

16. The array substrate as claimed in claim 15, wherein the active layer includes two of the nitrogen-doped oxide semiconductor layers and one of the non-nitrogen-doped oxide semiconductor layer.

17. The array substrate as claimed in claim 16, wherein the thickness of each of the nitrogen-doped oxide semiconductor layers is ranged from 8 nm to 12 nm, and the thickness of the non-nitrogen doped oxide semiconductor layer is ranged from 8 nm to 12 nm.

* * * * *